US012721109B2

(12) United States Patent
Hayashishita

(10) Patent No.: US 12,721,109 B2
(45) Date of Patent: Aug. 25, 2026

(54) ELECTRONIC COMPONENT MANUFACTURING METHOD, MANUFACTURING FILM, AND MANUFACTURING TOOL

(71) Applicant: MITSUI CHEMICALS ICT MATERIA, INC., Tokyo (JP)

(72) Inventor: Eiji Hayashishita, Nagoya (JP)

(73) Assignee: MITSUI CHEMICALS ICT MATERIA, INC., Tokyo (JP)

( * ) Notice: Subject to any disclaimer, the term of this patent is extended or adjusted under 35 U.S.C. 154(b) by 307 days.

(21) Appl. No.: 18/264,105

(22) PCT Filed: Feb. 10, 2022

(86) PCT No.: PCT/JP2022/005344

§ 371 (c)(1),
(2) Date: Aug. 3, 2023

(87) PCT Pub. No.: WO2022/172990

PCT Pub. Date: Aug. 18, 2022

(65) Prior Publication Data

US 2024/0312848 A1 Sep. 19, 2024

(30) Foreign Application Priority Data

Feb. 10, 2021 (JP) ................................ 2021-020210

(51) Int. Cl.

*H10P 74/20* (2026.01)
*G01R 31/28* (2006.01)
*H10P 72/70* (2026.01)

(52) U.S. Cl.

CPC ........ *H10P 74/207* (2026.01); *G01R 31/2867* (2013.01); *G01R 31/2896* (2013.01);

(Continued)

(58) Field of Classification Search

CPC ................ H01L 22/14; H01L 21/6836; H01L 2221/68368; H01L 2221/68381;

(Continued)

(56) References Cited

U.S. PATENT DOCUMENTS 5,605,844 A 2/1997 Oki et al.
6,479,305 B2 11/2002 Kono et al.

(Continued)

FOREIGN PATENT DOCUMENTS

JP 2000100822 A 4/2000
JP 2006258546 A 9/2006

(Continued)

OTHER PUBLICATIONS

Office Action issued on Nov. 19, 2024, by the Taiwan Intellectual Property Office in corresponding Taiwanese Patent Application No. 111104949 and an English Translation of the Office Action. (17 pages).

(Continued)

*Primary Examiner* — Vu A Vu
(74) *Attorney, Agent, or Firm* — BUCHANAN INGERSOLL & ROONEY PC

(57) ABSTRACT

A component manufacturing method includes: a step of arranging a plurality of electronic components in a state where electrodes are exposed, on a support having a substrate and a holding layer, with the holding layer interposed therebetween; and a step of evaluating electric characteristics of 80 or more of the electronic components among the electronic components arranged on the support by bringing all or some of the exposed electrodes and probes into contact with each other and simultaneously performing conduction evaluation. A component manufacturing film includes a resin base layer, the holding layer provided on one surface side of the resin base layer, and a joint layer that is provided (Continued)

on an opposite side of the resin base layer and bonds the component manufacturing film to the substrate. A component manufacturing tool includes the substrate and the holding layer provided to one surface of the substrate.

4 Claims, 3 Drawing Sheets

(52) U.S. Cl.
CPC ...... *H10P 72/7402* (2026.01); *H10P 72/7434* (2026.01); *H10P 72/744* (2026.01)

(58) Field of Classification Search
CPC ............. H01L 21/6835; H01L 21/6838; H01L 2221/68327; H01L 2221/68354; H01L 21/30; H01L 21/67242; G01R 31/2867; G01R 31/2896; G01R 31/2865; G01R 19/145; G01R 31/2853
USPC ............................................................ 438/17
See application file for complete search history.

(56) References Cited

U.S. PATENT DOCUMENTS 6,551,844 B1* 4/2003 Eldridge ............ G01R 1/07342 257/E23.068
6,573,112 B2 6/2003 Kono et al.
6,737,879 B2* 5/2004 Johnson ............. G01R 1/07314 324/756.05
6,762,611 B2* 7/2004 Hubner .................. G11C 29/48 324/762.03
6,897,666 B2* 5/2005 Swettlen ............ G01R 1/07378 324/754.07
7,126,228 B2* 10/2006 Hamren ............... G01R 1/0408 257/E23.166
7,157,923 B2* 1/2007 Schneider .......... G01R 31/2831 324/754.08
7,463,049 B2* 12/2008 Arai ................... G01R 31/2889 324/762.08
7,573,276 B2* 8/2009 Caldwell ............ G01R 31/2887 324/762.03
7,649,366 B2* 1/2010 Henson .............. G01R 31/2889 324/754.03
8,889,526 B2* 11/2014 Johnson .................. H01L 22/20 438/464
8,907,689 B2* 12/2014 Kister ................ G01R 31/2887 324/754.01
8,987,014 B2* 3/2015 Pendse .................... H01L 22/32 438/18
9,097,740 B2* 8/2015 Kister ................ G01R 1/07357
10,566,254 B2 2/2020 Hayashishita
10,809,293 B2 10/2020 Hayashishita
10,858,547 B2 12/2020 Hayashishita
11,035,898 B1* 6/2021 Humphrey ......... G01R 1/07342
11,047,900 B2 6/2021 Hayashishita
11,276,600 B2 3/2022 Hayashishita
11,453,208 B2 9/2022 Hayashishita
11,535,776 B2 12/2022 Hayashishita
2002/0064893 A1 5/2002 Kono et al.
2003/0027365 A1 2/2003 Kono et al.
2005/0227383 A1 10/2005 Okamoto et al.
2012/0018726 A1* 1/2012 Nakagawa .............. H01L 22/32 257/E21.59
2013/0029147 A1* 1/2013 Miki ................. C08F 220/1808 428/355 CN
2014/0051189 A1 2/2014 Kai-jun et al.
2015/0061718 A1 3/2015 Chan et al.
2018/0142130 A1 5/2018 Hayashishita
2019/0088559 A1 3/2019 Hayashishita
2019/0103298 A1* 4/2019 Hayashishita ............ C09J 7/22
2019/0271733 A1 9/2019 Hayashishita
2019/0285687 A1 9/2019 Hayashishita
2020/0171802 A1 6/2020 Hayashishita
2021/0047543 A1 2/2021 Hayashishita
2021/0172993 A1 6/2021 Hayashishita
2022/0157634 A1 5/2022 Hayashishita

FOREIGN PATENT DOCUMENTS

JP 2011112552 A 6/2011
JP 2013131594 A 7/2013
JP 2013173852 A 9/2013
JP 2015156438 A 8/2015
JP 2020003361 A 1/2020
TW 200605253 A 2/2006
WO 2017002610 A1 1/2017
WO 2017169747 A1 10/2017
WO 2017169896 A1 10/2017
WO 2018079551 A1 5/2018
WO 2018079552 A1 5/2018
WO 2018097036 A1 5/2018
WO 2020162231 A1 8/2020

OTHER PUBLICATIONS

Extended European Search Report dated Mar. 12, 2025, issued by the European Patent Office in corresponding European Application No. 22752812.2-1211, (13 pages).
International Search Report (PCT/ISA/210) with translation and Written Opinion (PCT/ISA/237) mailed on Apr. 26, 2022, by the Japanese Patent Office as the International Searching Authority for International Application No. PCT/JP2022/005344. (12 pages).
Office Action (Request for the Submission of an Opinion) issued on Sep. 3, 2024, by the Intellectual Property Office in corresponding Korean Patent Application No. 10-2023-7028242, and an English Translation of the Office Action. (11 pages).
Office Action (Notice of Reasons for Refusal) issued on Aug. 28, 2024, by the Japanese Patent Office in corresponding Japanese Patent Application No. 2022-580676, and an English Translation of the Office Action. (14 pages).
Office Action issued on Apr. 28, 2026, in corresponding Taiwanese Patent Application No. 111104949, and an English Translation of the Office Action. (10 pages).

* cited by examiner

[FIG.1]
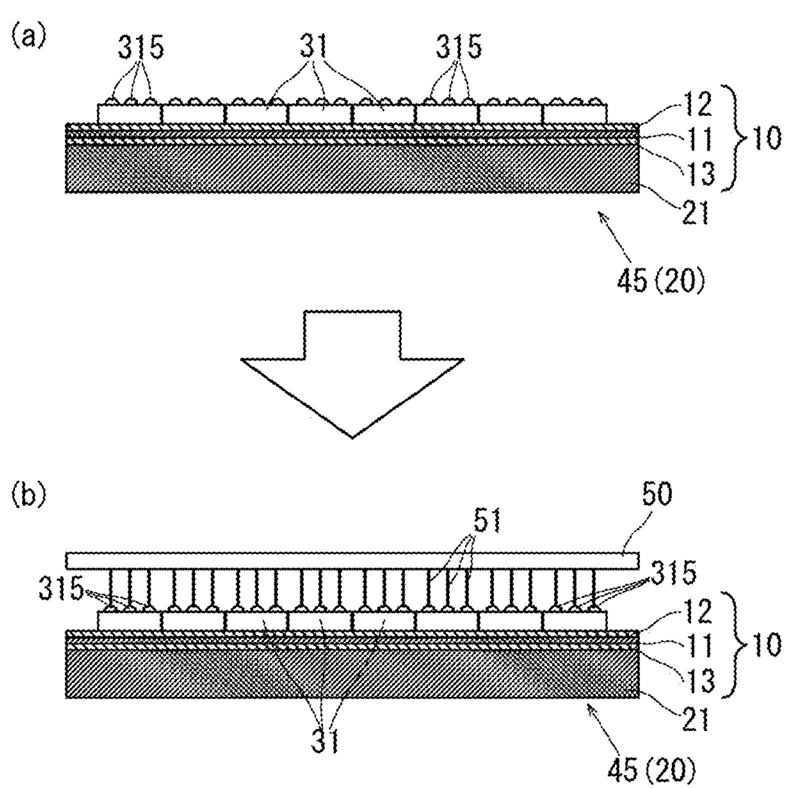
[FIG.2]
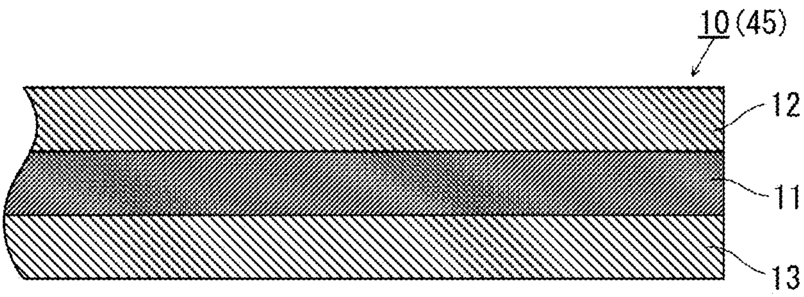

[FIG.3]
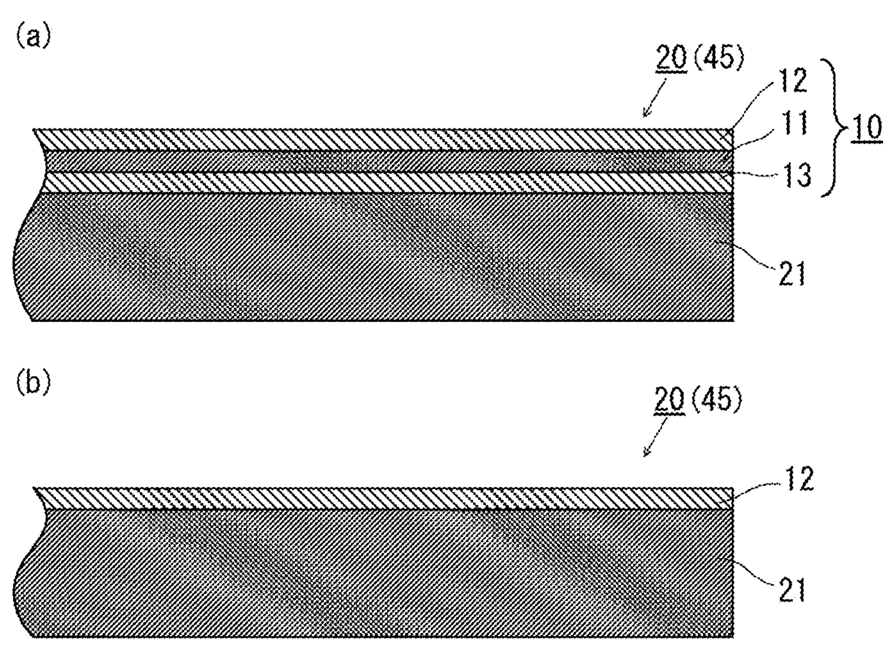
[FIG.4]
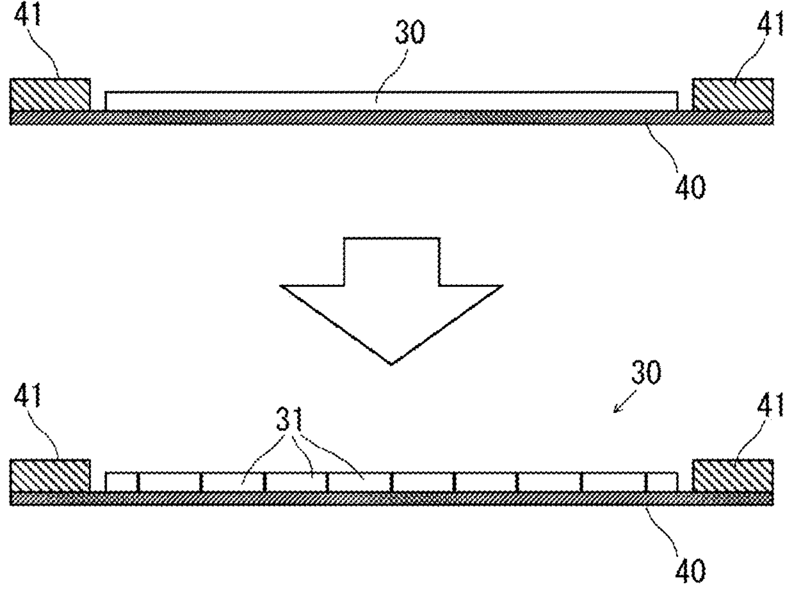

[FIG.5]
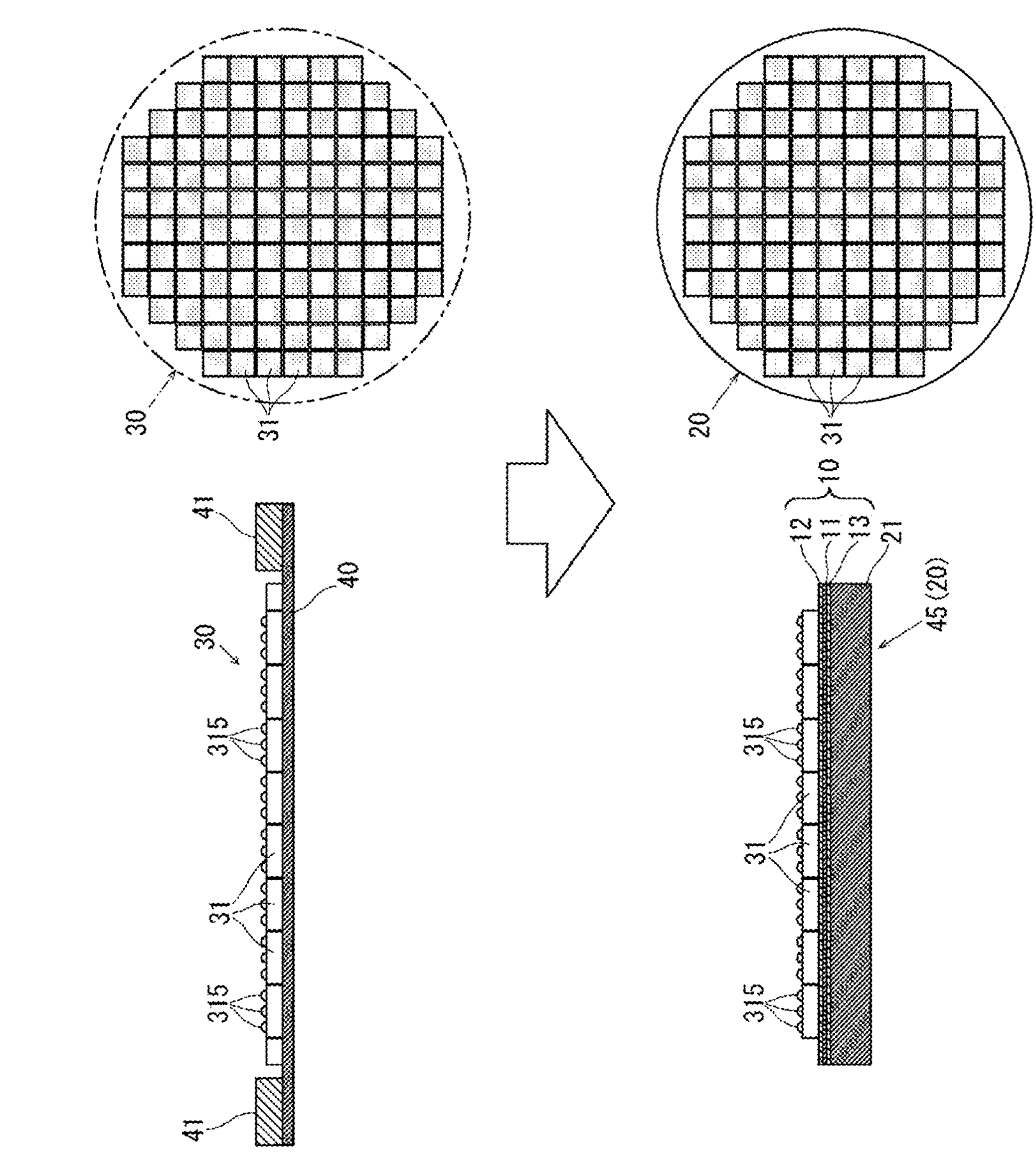

ELECTRONIC COMPONENT MANUFACTURING METHOD, MANUFACTURING FILM, AND MANUFACTURING TOOL

TECHNICAL FIELD

The present invention relates to an electronic component manufacturing method for simultaneously performing conduction evaluation on a plurality of segmented electronic components, an electronic component manufacturing film, and an electronic component manufacturing tool which are used in the electronic component manufacturing method.

BACKGROUND ART

Desirably, electronic components (such as a package component and a semiconductor chip) can be individually evaluated (inspected) at the time of manufacturing, and only those that have passed the evaluation can be selected at each stage so as to be sent to the next step. In other words, there is an object to improve the yield and realize cost reduction by performing the evaluation before sending to the next step and removing unsuitable components.

As the method for performing the evaluation, a method using an evaluation mount called a socket (see Patent Literature 1 below) and a technique using a holding film (see Patent Literature 2 below) are known.

CITATIONS LIST

Patent Literature

Patent Literature 1: JP 2011-112552 A
Patent Literature 2: WO 2017/002610 A

SUMMARY OF INVENTION

Technical Problems

In the evaluation step, similarly to the entire electronic component manufacturing process, there is a need for high efficiency leading to cost reduction.

In this regard, in the method using the socket, the number of types of electronic components to be evaluated is limited, and high evaluation efficiency can be obtained in the case of a known specification. However, the size, electrode position, and the like of the socket are exclusively designed for each of the electronic components to be measured, and as the electronic components become diversified, types of sockets also become diversified. Accordingly, a decrease in the degree of freedom with respect to the measurement target and a decrease in the evaluation efficiency become problems. Hence, since a new socket is required in accordance with a new specification of the electronic component, there is a problem that it takes time even for test operation, or it is necessary to change the specification to replace the socket with a required socket in a lot in which evaluation targets are different, whereby the evaluation efficiency is lowered.

On the other hand, the technique disclosed in Patent Literature 2 is a technique using a holding film common to three steps: an evaluation step, a segmentation step, and a pickup step. The use of the holding film allows for elimination of the socket, thereby eliminating the rate-limiting associated with the use of the socket. Meanwhile, the technique has been realized by using a characteristic material as a base layer of the holding film, and it has been found that an attempt to improve evaluation efficiency results in a problem attributed to the material of the base layer. Hence, it has been found that when evaluation is performed using this holding film, positional displacement may occur. The positional displacement tends to easily occur particularly when the number of evaluation targets is large and the measurement temperature is high.

The present invention has been made in view of the above problems, and an object of the present invention is to provide a component manufacturing method with high evaluation efficiency, and a component manufacturing film and a component manufacturing tool which are used in the component manufacturing method.

Solutions to Problems

As a means for solving the problems, the present invention is described as follows.

[1] An electronic component manufacturing method including:

an arrangement step of arranging a plurality of electronic components in a state where electrodes are exposed, on a support having a substrate and a holding layer, with the holding layer interposed therebetween; and an evaluation step of evaluating electric characteristics of 80 or more of the electronic components among the electronic components arranged on the support by simultaneously connecting the exposed electrodes and probes and performing conduction evaluation.

[2] The electronic component manufacturing method according to [1], in which the evaluation step is a step of performing the conduction evaluation in a state where the electronic components are heated.

[3] The electronic component manufacturing method according to [1] or [2], further including a segmentation step of segmenting a precursor electronic component on another support different from the support before the arrangement step to obtain the electronic component.

[4] The electronic component manufacturing method according to any one of [1] to [3] above, in which the holding layer has a characteristic that a holding force is reduced by heat application or energy ray irradiation.

[5] The electronic component manufacturing method according to any one of [1] to [3] above, in which the holding layer includes thermally expandable particles and has a characteristic that a holding force is reduced by heating.

[6] The electronic component manufacturing method according to any one of [1] to [5] above, in which the substrate is made of a metal.

[7] The electronic component manufacturing method according to any one of [1] to [6] above, in which the support includes a component manufacturing film adhered to one surface side of the substrate, and the component manufacturing film includes a resin base layer, the holding layer provided on one surface side of the resin base layer, and a joint layer that is provided on an opposite side of the resin base layer and bonds the component manufacturing film to the substrate.

[8] The electronic component manufacturing method according to any one of [1] to [7] above, in which the resin base layer has a linear thermal expansion coefficient of 100 ppm/K or less.

[9] The electronic component manufacturing method according to any one of [1] to [8] above, in which the resin base layer has a melting point of 180° C. or higher and a tensile elastic modulus E' (160) of 50 MPa or more at a temperature of 160° C.

[10] The electronic component manufacturing method according to any one of [1] to [9] above, in which in the arrangement step, a number of the electronic components to be arranged is 100 or more.

[11] A component manufacturing film used in the electronic component manufacturing method according to any one of [1] to [10] above, the component manufacturing film including:

a resin base layer;

the holding layer provided on one surface side of the resin base layer; and a joint layer that is provided on an opposite side of the resin base layer and bonds the component manufacturing film to the substrate.

[12] A component manufacturing tool used in the electronic component manufacturing method according to any one of [1] to [10] above, the component manufacturing tool including:

the substrate; and the holding layer provided on one surface of the substrate.

Advantageous Effects of Invention

According to the electronic component manufacturing method, and the electronic component manufacturing film and the electronic component manufacturing tool that are used in the method, of the present invention, it is possible to manufacture an electronic component with high evaluation efficiency.

BRIEF DESCRIPTION OF DRAWINGS

FIG. 1 is an explanatory view for explaining an arrangement step and an evaluation step in the present invention.

FIG. 2 is an explanatory view for explaining a component manufacturing film in the present invention.

FIG. 3 is an explanatory view for explaining a component manufacturing tool in the present invention.

FIG. 4 is an explanatory view for explaining a segmentation step in the present invention.

FIG. 5 is an explanatory view for explaining details of the arrangement step in the present invention.

DESCRIPTION OF EMBODIMENTS

Hereinafter, the present invention will be described with reference to the drawings. The matters shown herein are illustrative and for illustratively explaining embodiments of the present invention, and are stated for the purpose of providing what is considered to be a most effectively and easily comprehensible description of principles and conceptual characteristics of the present invention. In this respect, it is not intended to show more structural details of the present invention than necessary for fundamental understanding of the present invention but rather it is intended, with the explanation combined with the drawings, to make it obvious to the person skilled in the art how some forms of the present invention are embodied in actuality.

[1] Electronic Component Manufacturing Method

The electronic component manufacturing method according to the present invention includes:

an arrangement step of arranging a plurality of electronic components 31 in a state where electrodes 315 are exposed, on a support 45 having a substrate 21 and a holding layer 12, with the holding layer 12 interposed therebetween; and an evaluation step of evaluating electric characteristics of 80 or more of the electronic components 31 among the electronic components 31 arranged on the support 45 by simultaneously connecting the exposed electrodes 315 and probes and performing conduction evaluation (see FIG. 1).

(1) Arrangement Step

The arrangement step is a step of arranging the plurality of electronic components 31 in a state where the electrodes 315 are exposed, on the support 45 having the substrate 21 and the holding layer 12, with the protective layer 12 interposed therebetween (see FIG. 1(*a*)).

In the present invention, the electronic component 31 includes the following <A> and <B>:

<A> a semiconductor component: including a semiconductor chip obtained by segmenting (dicing) a semiconductor wafer, a silicon die, and the like; and <B> a package component: including a component segmented from a package array, a package component individually formed without passing through the package array, and the like.

In the package component, the sealing material is not limited, and an organic material (resin) and an inorganic material (such as ceramics, crystallized glass, or glass) can be used. Further, the package component includes a package component in which rewiring is not performed after sealing, a package component in a fan-out system (eWLB system) in which rewiring is performed after sealing, and a package component in a wafer level chip size package (WLCSP) system.

The electronic component 31 described above has an electrode which performs electric connection with the outside. The electronic component 31 may have only one electrode, or may have a plurality of electrodes. The form of the electrode electrically connectable to the outside is not limited, and for example, in a semiconductor component, a pad electrode, a bonding electrode, an exposed surface of a through electrode, and the like are included. Further, in the package component, a pad type electrode, a pin type electrode, a ball type electrode, a lead frame type electrode, and the like are included. Specifically, as the package component, a pin grid array (PGA) type of package component, a ceramic pin grid array (CPGA) type of package component, a plastic pin grid array (PPGA) type of package component, a staggered pin grid array (SPGA) type of package component, a ball grid array (BGA) type of package component, a land grid array (LGA) type of package component, a quad flat package (QFP) type of package component, a plastic quad flat package (PQFP) type of package component, a quad flat non-leaded (QFN) type of package component, a quad flat J-leaded (QFJ) type of package component, a plastic quad flat J-leaded (PQFJ) type of package component, a tape carrier package (TCP) type of package component, and a chip size package (CSP) type of package component, and the like are included.

Note that the electronic component 31 does not usually undergo a structural change before and after undergoing the arrangement step and the evaluation step. Hence, the electronic component 31 to be measured, which has been subjected to the arrangement step and the evaluation step, is the electronic component 31. However, in the electronic component manufacturing method according to the present invention, in a case where another step of adding another configuration to the electronic component 31 is performed after the evaluation step, the electronic component 31 to be measured can be rephrased as a precursor electronic component 31.

In the arrangement step, the electronic components 31 are arranged in a state where the electrodes 315 of the electronic components 31 are exposed to the outside to achieve electric connection with the outside. That is, the electronic components 31 are arranged on the support 45 with the holding layer 12 interposed therebetween to achieve electric connection of these electrodes 315 with the outside. Therefore, the electrodes 315 are normally arranged not to be held by the holding layer 12. Then, the electrodes 315 may be arranged to be exposed to the side of the electronic component 31, but from the viewpoint of facilitating contact with the probe, the electrodes 315 are preferably arranged to face upward above the holding layer 12. Hence, the electrodes 315 are preferably arranged with the main body of the electronic component 31 interposed therebetween, such that the electrodes 315 are positioned on the side opposite to the holding layer 12.

In the arrangement step, the number of the electronic components 31 to be arranged is not limited, but the present method simultaneously performs conduction evaluation on at least 80 or more of the electronic components 31. Thus, the number of the electronic components 31 to be arranged is usually 80 or more. The lower limit for the number of the electronic components 31 to be arranged can be set to, for example, 100 or more, and further can be set to 300 or more. Meanwhile, the upper limit for the number of the electronic components 31 to be arranged is not limited, but is usually 100000 or less. The upper limit for the number of the electronic components 31 to be arranged can be set to, for example, 10000 or less, and further can be set to 500 or less. Specifically, the number of the electronic components 31 to be arranged can be set to, for example, 80 or more and 100000 or less, 100 or more and 100000 or less, 300 or more and 100000 or less, 80 or more and 10000 or less, 100 or more and 10000 or less, 300 or more and 10000 or less, 80 or more and 500 or less, 100 or more and 500 or less, or 300 or more and 500 or less.

The electronic components 31 are arranged on the holding layer 12, upon being arranged on the support 45. That is, the holding layer 12 is a layer for holding the electronic components 31, and the electronic components 31 are arranged on the holding layer 12.

The support 45 is not limited as long as it has the substrate 21 and the holding layer 12, but a component manufacturing film 10 (see FIG. 2) and a component manufacturing tool 20 (see FIGS. 3(*a*) and 3(*b*)) of the present invention to be described later can be used. These will be described in detail later.

For example, as shown in FIG. 5, in the case of the electronic components 31 arranged on a segmenting support 40 to be described later, the electronic components 31 may be subjected to evaluation (inspection) before the arrangement step. In this case, only the electronic components 31 suitable for proceeding to the next step can be picked up from the segmenting support 40 and arranged on an evaluating support 45. Then, for example, in a case where only some of the electronic components 31 on the segmenting support 40, which have passed the evaluation, are transferred onto the evaluating support 45, the electronic components 31 on another segmenting support 40, which have passed the evaluation, can be added to an empty space on the evaluating support 45. In this manner, the space on the evaluating support 45 can be used without waste and simultaneous evaluation can be performed.

(2) Evaluation Step

The evaluation step is a step of evaluating electric characteristics of 80 or more of the electronic components 31 among the electronic components 31 arranged on the support 45 by simultaneously connecting the exposed electrodes 315 and probes 51 and performing conduction evaluation (see FIG. 1(*b*)). Here, each of the electronic components has a plurality of electrodes, but it is not necessary to allow all the plurality of electrodes of each of the electronic components to be connected.

Further, regarding this evaluation step, it is possible to include a connection step of electrically connecting exposed electrodes on 80 or more of the electronic components, among the electronic components having the exposed electrodes, and probes. Then, it is possible to include an evaluation step of evaluating electric characteristics of 80 or more of the electronic components electrically connected to the probes by collectively performing conduction evaluation.

Therefore, the electronic component manufacturing method according to the present invention includes:

an arrangement step of arranging a plurality of electronic components in a state where electrodes are exposed, on a support having a substrate and a holding layer, with the holding layer interposed therebetween;

a connection step of electrically connecting the exposed electrodes on 80 or more of the electronic components, among the electronic components having the exposed electrodes, and probes; and an evaluation step of evaluating electric characteristics of 80 or more of the electronic components electrically connected to the probes by collectively performing conduction evaluation.

The probe 51 is a member that is in electric contact with the exposed electrode 315 of the electronic component 31. The structure of the probe 51 is not limited, and a known structure can be used. For example, it is possible to include a conductive pin having electric conductivity, an elastic body (such as coil spring or elastic resin) that adjusts a contact force between the conductive pin and the electrode 315, a guide portion that regulates a movable direction of the conductive pin, and the like.

Meanwhile, the electrode 315 includes an outer lead electrode of a lead frame, a pin grid electrode, a ball grid electrode (solder ball), a land electrode, and other electrode forms.

As described above, in the present method, since 80 or more of the electronic components are simultaneously connected and subjected to conduction evaluation, 80 sets or more of the probes 51 are needed. The number of the probes included in one set is not limited, but is at least 1 or more, and can be set to 10 or more, and can be further set to 100 or more (usually, the number of the probes included in one set is 10000 or less). These probes 51 can be formed integrally with a probe card 50 (probe attached substrate), for example. Note that, as a matter of course, all or some of the probes 51 may be used in the conduction evaluation.

Some or all of the electronic components 31 arranged on the support 45 may be subjected to conduction evaluation. Varying depending on the necessity, from the viewpoint of manufacturing efficiency and cost reduction, preferably, a larger number of the electronic components 31 is simultaneously connected and subjected to conduction evaluation.

For example, as shown in FIG. 1(*b*), in the evaluation step, the probe card 50 provided with a plurality of probes 51 is brought into contact with the electrodes 315 exposed from the electronic components 31 arranged on the holding layer 12 to make electric connection. For example, it is possible to determine whether a signal exchanged between the probes 51 and a circuit formed on the electronic components 31 is correct (probe test).

Here, the connection between the exposed electrodes 315 and the probes 51 may be simultaneously performed between all the electrodes 315 and the probes 51. For example, there may be an aspect in which the electrodes 315 are connected from the center of the probe card 50 toward the outer peripheral side, and as a result, electric connection with 80 or more of the electronic components 31 is completed at the time of conduction evaluation, an aspect in which the electrodes 315 are connected from the outer peripheral side toward the center of the probe card 50, and as a result, electric connection with 80 or more of the electronic components 31 is completed at the time of conduction evaluation, or the like. In other words, in the connection step, the electrodes 315 may be connected simultaneously to the probes 51, or the electrodes 315 may be temporarily connected to the probes 51. Consequently, it is sufficient that the electric connection between the electrodes 315 of 80 or more of the electronic components and the probes 51 is completed before the conduction evaluation starts.

A specific configuration of the probe card 50 is not limited, and a probe card designed according to the number of the electronic components 31 to be simultaneously evaluated or the arrangement of the electronic components 31 on the support 45 can be used. In particular, in the evaluation mechanism used in the present method, a large probe card including a large number of probes that can be simultaneously connected to a plurality of electrodes of 80 or more electronic components can be used. In addition, to perform individual evaluations if necessary, namely, it is possible to use a small probe card provided with a small number of probes that can be simultaneously connected, for example, to a plurality of electrodes of one electronic component.

The contents, purpose, and the like of the conduction evaluation are not limited, and examples thereof include contents and purposes of operation confirmation or acceleration durability test. More specific examples thereof include a direct current application test that can evaluate the presence or absence of disconnection or short circuit, an input voltage, an output voltage, an output current, and the like, an alternating current application test that can evaluate an output waveform, and a function test such as evaluation of whether or not to write, read, and calculate, and of speed, evaluation of holding time, or evaluation of mutual interference. That is, examples thereof include a final test, a structuring test, a scan test, and an adaptive test in a package component; and a wafer test and a burn-in test in a semiconductor component. These tests may be used singly or in combination of two or more kinds thereof.

Further, in the conduction evaluation, it is possible to collectively evaluate 80 or more of the electronic components 31 electrically connected. This evaluation may be simultaneously performed or sequentially performed on 80 or more of the electronic components 31. Hence, it is sufficient that 80 or more of the electronic components 31 can be evaluated without eliminating the electric connection between the electrodes 315 and the probes 51.

In the evaluation step in the present manufacturing method, preferably, the conduction evaluation can be performed in a state where the electronic components 31 are heated. In this case, for example, the support 45 in a form in which the electronic components 31 are bonded to the holding layer 12 of the component manufacturing tool 20 can be used as the support 45. That is, the component manufacturing tool 20 is fixed to a vacuum chuck table (not shown) with the substrate 21 interposed therebetween. The component manufacturing tool 20 (i.e. the support 45) is heated from the side of the vacuum chuck table, as a result of which conduction evaluation can be performed on the electronic components 31 in a heated state.

The temperature range in the heated state in the evaluation step varies depending on the intended use of the electronic component 31, and is not particularly limited. The lower limit of this temperature range can be set to, for example, 50° C. or higher, can be further set to 100° C. or higher, and can be further set to 150° C. or higher. Meanwhile, the upper limit of the temperature range is usually 250° C. or lower.

In the case of performing the conduction evaluation in a heated state, for example, when a film-shaped support is used as the support, the positions of the electronic components 31 may change due to thermal expansion in the heated state. Such a change in the positions of the electronic components 31 causes positional displacement of the electronic components 31 with respect to the probes 51. This positional displacement becomes larger as the number of simultaneous measurements of the electronic components 31 increases, and is particularly remarkable when the number of simultaneous measurements is 80 or more.

Therefore, in the present method, the support 45 including the substrate 21 is used. That is, as the support 45, the following supports (A) and (B) are exemplified.

(A) A support 45 having a configuration including a substrate 21 and a component manufacturing film 10 bonded to one surface side of the substrate 21, in which the component manufacturing film 10 includes a base layer (resin base layer) 11, a holding layer 12 provided on one surface side of the base layer 11, and a joint layer 13 provided on an opposite side of the base layer 11, the joint layer being used for the substrate 21 (see FIG. 3(*a*)).

(B) A support 45 having a configuration including a substrate 21 and a holding layer 12 provided on one surface side of the substrate 21 (see FIG. 3(*b*)).

As described above, the support 45 includes the substrate 21, and thus it is possible to allow the substrate 21 to function to hold the positions of the electronic components 31, particularly the positions in the horizontal direction of the electronic components 31 where the relative positional displacement with respect to the probes 51 remarkably appears.

Note that, in the above support (B), a configuration other than the substrate 21 and the holding layer 12 may be provided, but unlike the support (A), a configuration without the base layer 11 may be provided, and further, a configuration including only the substrate 21 and the holding layer 12 may be provided.

According to these supports 45, it is possible to function to prevent relative positional displacement between the electronic components 31 and the probes 51 even during heating. That is, for example, in the case of the support 45 having the configuration (A), relative positional displacement between the electronic components 31 and the probes 51 during heating can be prevented by adopting a configuration in which the component manufacturing film 10 is bonded to the substrate 21, a high-temperature resin is used as the base layer 11 forming the component manufacturing film 10, the thickness of the base layer 11 is increased, or the like.

Therefore, the use of the support (A) and/or the support (B) as the support 45 makes it possible to more reliably perform simultaneous measurement of a plurality of the electronic components 31 in the evaluation step, and to further improve the manufacturing efficiency.

(3) Another Step

The present method can include another step other than the arrangement step and the evaluation step as described above. Examples of the other step include a segmentation step of obtaining the segmented electronic components 31 as a pre-step of the arrangement step, and a pickup step of separating the electronic components 31 from the support 45 as a post-step of the evaluation step.

Among the steps described above, the segmentation step is a step of segmenting (dicing) a precursor component 30 (such as an array-like electronic component or a semiconductor wafer) to which elements as the plurality of electronic components 31 are bonded to obtain the electronic components 31. At this time, the segmenting support 40 can be bonded to the back surface (see FIG. 4). The segmentation step can be appropriately performed using a known method.

In the segmentation step, the segmenting support 40 is stuck from the back surface of the frame 41 to cover the opening, and the precursor component 30 is stuck on the segmenting support 40 inside the frame 41.

The precursor component 30 used in the segmentation step has the electrodes 315 formed on the surface thereof. The electrodes are as described above. Further, in a semiconductor component (wafer), a circuit is usually formed on the surface thereof. Examples of the circuit include a wiring line, a capacitor, a diode, and a transistor. These tests may be used singly or in combination of two or more kinds thereof.

Further, at the time of segmentation, the package component may be segmented such that at least one semiconductor component (semiconductor chip) is included in one electronic component 31, or may be segmented such that two or more semiconductor components (semiconductor chips) are included in one electronic component 31.

Note that the package array described above is the precursor component 30 in which a large number of semiconductor chips (silicon dies) is arranged and sealed, and means a form in which the package component before being segmented is included in the array.

On the other hand, among the steps described above, when only some of the plurality of electronic components 31 on the segmenting support 40 are removed or when the electronic components 31 on the segmenting support 40 are removed one by one, the removed electronic components 31 in a state of being arranged on the segmenting support 40 can be arranged to be transferred onto the evaluating support 45, and can also be arranged on the evaluating support 45 to have a different arrangement from the arrangement on the segmenting support 40.

As described above, in the known evaluation, the socket (evaluation mount) is used. In a case where different electronic components are evaluated, a case where different types of electronic components are mixed, or the like, it is necessary to change the specification of the evaluation board by replacing the socket each time.

On the other hand, in the present method, it is not necessary to use the socket. As for the support 45, a film or a substrate can be used as the electronic component manufacturing film or the electronic component manufacturing tool. Thus, in the present method, the cost of jigs associated with the use of the socket can be reduced.

Further, the electronic components 31 are directly arranged on the support 45 such that the electrodes 315 are exposed, and then the electric characteristics of the electronic components 31 can be evaluated using the exposed electrodes 315. Accordingly, it is not necessary to change the specification of the evaluation board, and it is possible to suppress an increase in the number of steps, improve the manufacturing efficiency, and reduce the cost.

Further, the socket usually has a partition wall (side wall) for defining the housing position of the electronic component to be evaluated. Thus, on the evaluation board, a space occupied by the thicknesses of two partition walls of the socket is necessary for one electronic component. Accordingly, when intending to increase the number of the electronic components to be evaluated in one evaluation, the area occupied by the partition walls of the socket on the measurement board is also increased. Hence, there is a dilemma that the area occupied by the partition walls is increased when the number of electronic components to be simultaneously evaluated is increased, and there is a disadvantage that it is difficult to increase the number of electronic components that can be arranged.

On the other hand, in the present method, the electronic components 31 are arranged on the support 45 to be in a state where the electrodes 315 are exposed, and then the electric characteristics of the electronic components 31 can be evaluated using the exposed electrodes 315. Hence, since the socket is not used, the partition walls can be eliminated. The electronic components 31 can be arranged in the region corresponding to the area occupied by the partition walls. Therefore, it is possible to simultaneously evaluate a larger number of the electronic components 31.

In addition, since the housing position of the electronic component is not fixed by the socket, the degree of freedom in the arrangement of the electronic components 31 to be arranged on the support 45 is high, and various types of electronic components can be arranged by performing optimization calculation such that the number of electronic components to be evaluated is increased for each lot for evaluation. Hence, for example, the electronic components 31 can be arranged to have the highest area efficiency. As will be described later, when a probe card is used or the like, the optimization can be performed to increase the number of electronic components to be simultaneously evaluated by the probe card.

Further, in the method of the present invention, a probe is utilized in conduction evaluation. For example, a probe card is arranged above the electronic components 31 being on the support 45 such that the electrodes 315 are exposed. Then, either the electronic components 31 or the probe card, or both the electronic components 31 and the probe card are brought close to each other and subjected to contact conduction, whereby evaluation can be performed.

Further, since the electronic components 31 only need to be arranged such that the electrodes 315 are exposed to be connectable to the outside, various different electronic components can be freely arranged on the support 45. At the time of conduction evaluation, for example, simultaneous evaluation is performed by the probe card such that the number of electronic components to be evaluated is the largest. Thereafter, the electronic components that cannot be simultaneously evaluated can be individually evaluated while maintaining the state of the support 45. Even in this case (even if the number of contact needles is increased), it is not necessary to stop the device for changing the evaluation board as in the case of using the socket, as a result of which excellent work efficiency can be obtained.

Furthermore, if necessary, in addition to the probe card, it is possible to provide a mechanism of the evaluation of the contact needles for single measurement which can adjust the position based on the image acquisition and the acquired image. As a result, a type of electronic components whose number is large can be simultaneously evaluated by the probe card, and a type of electronic components whose number is small can be individually evaluated by reading the position.

[2] Component Manufacturing Film

The component manufacturing film 10 (hereinafter, also abbreviated as "film 10") of the present invention is used by being bonded to one surface side of the substrate 21 to evaluate electric characteristics of the electronic components 31.

The film 10 includes a resin base layer 11 (hereinafter, also abbreviated as "base layer 11"), the holding layer 12, and a joint layer 13 (see FIG. 2).

The holding layer 12 is a layer provided on one surface side of the base layer 11 to hold a plurality of the electronic components 31 side by side.

The joint layer 13 is a layer provided on the opposite side of the base layer 11 to bond the film 10 to the substrate 21.

Hereinafter, each layer of the film 10 will be described.

(1) Base Layer (Resin Base Layer)

The base layer 11 is a layer provided for the purpose of improving the handleability, mechanical properties, and the like of the film 10.

The material used for the base layer 11 is not particularly limited, but is preferably a material having mechanical strength capable of withstanding a measurement environment in the evaluation step to be described later, particularly a material capable of suppressing thermal expansion and elongation in the heated state. Usually, a resin can be used as the material of the base layer 11.

Examples of the resin that can constitute the base layer 11 include polyolefin-based resins such as polyethylene, polypropylene, poly(4-methyl-1-pentene), and poly(1-butene); aromatic polyester-based resins such as polyethylene terephthalate (PET), polybutylene terephthalate (PBT), and polyethylene naphthalate (PEN); polyimide-based resins such as semi-aromatic polyimide and aromatic polyimide; polyamide-based resins such as nylon-6, nylon-66, and polymethaxylene adipamide; and one or two or more thermoplastic resins selected from polyacrylate, polymethacrylate, polyvinyl chloride, polyether imide, polyacrylonitrile, polycarbonate, polystyrene, ionomer, polysulfone, polyether sulfone, and polyphenylene ether.

Among the resins described above, in the case of having a melting point, the melting point is preferably 180° C. or higher, more preferably 200° C. or higher, and particularly preferably 220° C. or higher from the viewpoint of suppressing positional displacement in the heated state in the evaluation step. Meanwhile, the melting point is, for example, preferably 800° C. or lower, and more preferably 600° C. or lower. Specifically, the melting point can be set to, for example, 180° C. or higher and 800° C. or lower, 200° C. or higher and 800° C. or lower, 220° C. or higher and 800° C. or lower, 180° C. or higher and 600° C. or lower, 200° C. or higher and 600° C. or lower, or 220° C. or higher and 600° C. or lower. The melting point is a melt peak temperature according to JIS K7121.

Further, the linear thermal expansion coefficient of the base layer 11 is preferably 100 ppm/K or less (thermal expansion rate at a temperature of 25 to 150° C.). This makes it possible to more effectively suppress positional displacement in the heated state in the evaluation step. This value is usually 5 ppm/K or more. Further, the linear thermal expansion coefficient is preferably 90 ppm/K or less, and more preferably 50 ppm/K or less. The thermal expansion coefficient is a value measured in accordance with JIS K7197.

Further, the tensile elastic modulus E' (160) of the base layer 11 at a temperature of 160° C. is preferably 50 MPa or more. This makes it possible to more effectively suppress positional displacement in the heated state in the evaluation step. This value is usually 5000 MPa or less. Further, the tensile elastic modulus E' (160) is preferably 100 MPa or more, and more preferably 200 MPa or more.

The tensile elastic modulus E' (160) can be measured by a dynamic viscoelasticity measuring device (DMA: Dynamic Mechanical Analysis) (product name: RSA-3, manufactured by TA Instruments). Specifically, the tensile elastic modulus is obtained by reading data at 160° C. from data obtained by measuring from −20° C. to 200° C. under measurement conditions in which a sample size is 10 mm in width and 20 mm in length between chucks, a frequency is 1 Hz, and a temperature raising rate is 5° C./min.

Examples of the resin that can satisfy all of the above-mentioned heat-resistant characteristics include polyethylene terephthalate, polybutylene terephthalate, polyethylene naphthalate, polycarbonate, and polyimide. These tests may be used singly or in combination of two or more kinds thereof.

As an additive, a plasticizer, a softener (mineral oil, etc.), a filler (carbonate, sulfate, titanate, silicate, oxides (titanium oxide, magnesium oxide), silica, talc, mica, clay, fiber filler, etc.), an antioxidant, a light stabilizer, an antistatic agent, a lubricant, a colorant, or the like can be added to the resin described above. These additives may be used singly or in combination of two or more kinds thereof.

As the film used for the base layer 11, any stretched film such as an unstretched film, a uniaxially stretched film, or a biaxially stretched film can be used regardless of whether or not the film is stretched.

As the above-mentioned film, either a single layer film or a multilayer film having a plurality of layers can be used.

For the base layer 11, a surface-treated film is preferably used from the viewpoint of improving adhesiveness with the holding layer 12 and the joint layer 13. Specific examples of the surface treatment include a corona treatment, a plasma treatment, an undercoat treatment, and a primer coat treatment.

The thickness of the base layer 11 is not particularly limited, but can be set to, for example, 1 μm or more and 1000 μm or less, 5 μm or more and 500 μm or less, or 10 μm or more and 250 μm or less.

(2) Holding Layer

The holding layer 12 is a layer for holding a plurality of the electronic components 31 side by side, and can be formed of, for example, an adhesive.

The adhesive force of the adhesive that forms the holding layer 12 is not particularly limited. Preferably, the 180° peeling adhesive force measured in accordance with JIS 20237 is 0.1 N/25 mm or more and 10 N/25 mm or less except that the adherend is a silicon wafer when the adhesive is peeled off from the surface of the silicon wafer after being bonded to the surface of the silicon wafer and left for 60 minutes. When the adhesive force is in the above range, good adhesiveness with the electronic components 31 can be secured. The adhesive force is more preferably 0.2 N/25 mm or more and 9 N/25 mm or less, and still more preferably 0.3 N/25 mm or more and 8 N/25 mm or less. The above measurement value is a value obtained by separately providing the holding layer 12 on a 38 μm-thick biaxially stretched PET film.

From the viewpoint of suitably picking up the electronic component 31, the holding layer 12 preferably has a characteristic that the holding force is reduced by heat application or energy ray irradiation.

The adhesive used for the holding layer 12 is not particularly limited, and examples of the adhesive having the above characteristic include a foamable adhesive whose adhesive force is reduced or lost by heat application and an energy curable adhesive whose adhesive force is reduced or lost by energy ray irradiation.

The foamable adhesive and the energy curable adhesive both contain at least an adhesive base compound. Examples of the adhesive base compound include an acrylic adhesive, a silicone-based adhesive, and a rubber-based adhesive. These tests may be used singly or in combination of two or more kinds thereof. Among them, an acrylic adhesive is preferable.

Examples of the acrylic adhesive include a homopolymer of an acrylic acid ester compound and a copolymer of an acrylic acid ester compound and a comonomer. These tests may be used singly or in combination of two or more kinds thereof.

Examples of the acrylic acid ester compound include methyl acrylate, ethyl acrylate, butyl acrylate, and 2-ethylhexyl acrylate. These tests may be used singly or in combination of two or more kinds thereof.

Furthermore, examples of the comonomer include vinyl acetate, acrylonitrile, acrylamide, styrene, methyl (meth) acrylate, (meth)acrylic acid, hydroxyethyl methacrylate, dimethylaminoethyl methacrylate, glycidyl methacrylate, and maleic anhydride.

The adhesive may contain a crosslinking agent, in addition to the above-mentioned adhesive base compounds.

Examples of the crosslinking agent include epoxy-based crosslinking agents (such as pentaerythritol polyglycidyl ether) and isocyanate-based crosslinking agents (such as diphenylmethane diisocyanate, tolylene diisocyanate, tetramethylene diisocyanate, hexamethylene diisocyanate, and polyisocyanate). These crosslinking agents may be used singly or in combination of two or more kinds thereof.

When the adhesive contains a crosslinking agent, the content of the crosslinking agent is preferably 10 parts by mass or less relative to 100 parts by mass of the entire adhesive. The adhesive force of the adhesive can be adjusted by the content of the crosslinking agent. Specifically, a method described in JP 2004-115591 A can be used.

The foamable adhesive is an adhesive that is foamed by heat application, thereby lowering or losing the adhesive force of the holding layer 12 with respect to the electronic component 31. Such a foamable adhesive can be realized by adding a thermally expandable foaming agent (hereinafter, also simply referred to as "foaming agent") to the adhesive. The foaming agent may be added to the adhesive as it is, or may be contained by being bonded to the adhesive, or can be used as thermally expandable particles such as thermally expandable microspheres in which the foaming agent is enclosed in an outer shell (such as a microcapsule).

Among the foaming agents described above, the mechanism of the thermally expandable particles is not limited, and for example, the following mechanisms (1) and (2) can be exemplified. Mechanism (1): the inclusion of the thermally expandable particles is expanded by heating, the material constituting the outer shell is softened by the heating, and the entire thermally expandable particles are expanded, whereby the volume of the thermally expandable particles in the adhesive can be increased. As a result, the adhesive area between the electronic component 31 held by the holding layer 12 and the adhesive is reduced, and the adhesive force of the holding layer 12 with respect to the electronic component 31 can be lowered or lost. Mechanism (2): the inclusion of the thermally expandable particles is expanded by heating, and the outer shell is broken by the expanded object, whereby the volume of the expanded object in the adhesive can be increased. As a result, the adhesive area between the electronic component 31 held by the holding layer 12 and the adhesive is reduced, and the adhesive force of the holding layer 12 with respect to the electronic component 31 can be lowered or lost. Either the mechanism (1) or the mechanism (2) may be used or the mechanism (1) may be used in combination with the mechanism (2). Furthermore, the mechanism of the lowering or losing of the adhesive force due to the thermally expandable particles is not limited to the mechanisms (1) and (2) described above.

Examples of the foaming agent described above include inorganic foaming agents and organic foaming agents. These tests may be used singly or in combination of two or more kinds thereof.

Examples of the inorganic foaming agents include ammonium carbonate, ammonium hydrogen carbonate, sodium hydrogen carbonate, ammonium nitrite, sodium borohydride, various inorganic azide compounds (metal azide compounds, etc.), and water. These tests may be used singly or in combination of two or more kinds thereof.

Meanwhile, examples of the organic foaming agents include chlorofluoroalkane-based compounds such as trichloromonofluoromethane and dichloromonofluoromethane; azo-based compounds such as azobisisobutyronitrile, azodicarbonamide, and barium azodicarboxylate; hydrazine-based compounds such as p-toluenesulfonylhydrazide, diphenylsulfone-3,3'-disulfonylhydrazide, 4,4'-oxybis(benzenesulfonylhydrazide), and allylbis(sulfonylhydrazide); semicarbazide-based compounds such as p-toluylenesulfonylsemicarbazide and 4,4'-oxybis(benzenesulfonylsemicarbazide); triazole-based compounds such as 5-morpholyl-1,2,3,4-thiatriazole; N-nitroso-based compounds such as N,N'-dinitrosopentamethylenetetramine and N,N'-dimethyl-N,N'-dinitrosoterephthalamide; organic azide compounds; and derivatives of Meldrum's acid. These tests may be used singly or in combination of two or more kinds thereof.

In particular, when a foaming agent is used as thermally expandable particles, liquid alkanes having a boiling point of 100° C. or lower, such as isobutane, propane, and pentane, can be enclosed in the outer shell to be used as the foaming agent. That is, a component that can be thermally vaporized and expanded can be used. These tests may be used singly or in combination of two or more kinds thereof.

Examples of the material forming the outer shell include a vinylidene chloride-acrylonitrile copolymer, polyvinyl alcohol, polyvinyl butyral, polymethyl methacrylate, polyacrylonitrile, polyvinylidene chloride, and polysulfone. These tests may be used singly or in combination of two or more kinds thereof.

Furthermore, when a foaming agent is used, the blending amount of the foaming agent is not limited. For example, 1 part by mass or more, further 5 parts by mass or more, and furthermore 10 parts by mass or more of the foaming agent (particularly, thermally expandable particles) can be blended, when the amount of the adhesive base compound constituting the foamable agent is set to 100 parts by mass. Meanwhile, the blending amount can be set to, for example, 150 parts by mass or less, can be further set to 130 parts by mass or less, and can be further set to 100 parts by mass or less. Specifically, the blending amount can be set to, for example, 1 part by mass or more and 150 parts by mass or less, 5 parts by mass or more and 150 parts by mass or less, 10 parts by mass or more and 150 parts by mass or less, 1 part by mass or more and 130 parts by mass or less, 5 parts by mass or more and 130 parts by mass or less, 10 parts by mass or more and 130 parts by mass or less, 1 part by mass or more and 100 parts by mass or less, 5 parts by mass or more and 100 parts by mass or less, or 10 parts by mass or more and 100 parts by mass or less.

In the foamable adhesive, the foaming temperature is preferably set to a temperature more than the heating temperature in the evaluation step to be described later. Specifically, the foaming temperature can be set to higher than 120° C., can be set to 135° C. or higher, and can be set to 150° C. or higher.

Meanwhile, the energy curable adhesive is an adhesive that can lower or lose the adhesive force by curing the adhesive by irradiating the adhesive with energy rays.

Examples of the energy rays include ultraviolet rays, electron beams, and infrared rays. These energy rays may be used singly or in combination of two or more kinds thereof. Specifically, an ultraviolet curable adhesive that is cured by ultraviolet rays is used.

The energy curable adhesive can contain, in addition to the above-mentioned adhesive base compound, a compound having a carbon-carbon double bond in the molecule (hereinafter, simply referred to as "curable compound") and a photopolymerization initiator capable of initiating polymerization of the curable compound in response to energy rays. The curable compound is preferably a monomer, oligomer, and/or polymer which has a carbon-carbon double bond in the molecule and is curable by radical polymerization.

Specific examples of the curable compound include trimethylolpropane tri(meth)acrylate, pentaerythritol tri(meth) acrylate, dipentaerythritol hexa(meth)acrylate, tetraethylene glycol di(meth)acrylate, 1,6-hexanediol di(meth)acrylate, and neopentyl glycol di(meth)acrylate. These tests may be used singly or in combination of two or more kinds thereof.

When the adhesive contains a curable compound, the content of the curable compound is preferably 0.1 to 20 parts by mass relative to 100 parts by mass of the adhesive.

Incidentally, the carbon-carbon double bond in the molecule may be included such that the above-described adhesive base compound contains a carbon-carbon double bond in the molecule. That is, for example, the adhesive base compound can be an energy curable polymer having a carbon-carbon double bond in a side chain. As described above, when the adhesive base compound has a curable structure in the molecule, the above-described curable compound may be or need not be blended.

As the photopolymerization initiator, a compound that can generate radicals by irradiation with energy rays is preferable.

Specific examples of the photopolymerization initiator include acetophenone-based photopolymerization initiators {methoxyacetophenone, etc.}, α-ketol compounds {4-(2-hydroxyethoxy)phenyl(2-hydroxy-2-propyl)ketone, α-hydroxycyclohexyl phenyl ketone, etc.}, ketal-based compounds {benzyldimethylketal, etc.}, benzoin-based photopolymerization initiators {benzoin, benzoin alkyl ethers (benzoin methyl ether, benzoin isopropyl ether, benzoin isobutyl ether), etc.}, benzophenone-based photopolymerization initiators {benzophenone, benzoylbenzoic acid, etc.}, and aromatic ketals {benzyldimethylketal, etc.}. These tests may be used singly or in combination of two or more kinds thereof.

When the adhesive contains a photopolymerization initiator, the content of the photopolymerization initiator is preferably 5 to 15 parts by mass relative to 100 parts by mass of the adhesive.

For the holding layer 12, of the foamable adhesive and the energy curable adhesive described above, the foamable adhesive is preferable from the viewpoint that the electronic components 31 floating on the surface of the holding layer 12 can be satisfactorily picked up and the viewpoint of the balance with the joint layer 13 to be described later, and further, the use of thermally expandable particles is particularly preferable.

The thickness of the holding layer 12 is not particularly limited, but can be set to, for example, 1 μm or more and 1000 μm or less, can be further set to 3 μm or more and 500 μm or less, can be further set to 5 μm or more and 250 μm or less, and can be further set to 10 μm or more and 150 μm or less.

(3) Joint Layer

The joint layer 13 is a layer for joining the film 10 with the substrate 21, and is formed of an adhesive.

The thickness of the joint layer 13 can be set to, for example, 1 μm or more and 1000 μm or less, can be further set to 3 μm or more and 500 μm or less, can be further set to 5 μm or more and 250 μm or less, and can be further set to 10 μm or more and 150 μm or less.

The adhesive used for the joint layer 13 is not particularly limited as long as it enables the film 10 to be joined with the substrate 21 to be described later.

Usually, the adhesive contains at least an adhesive base compound. As the adhesive base compound, an adhesive base compound similar to those exemplified for the holding layer 12 can be used.

In addition, as the adhesive of the joint layer 13, the energy curable adhesive described above in the holding layer 12 can be used.

In particular, when a foamable adhesive is used for the holding layer 12 described above, the object to be peeled off can be selected as desired by selecting either heat addition or energy ray irradiation.

For example, when the foamable adhesive is used for the holding layer 12 and the energy curable adhesive is used for the joint layer 13, only the electronic component 31 can be peeled off at the time of heat application, and the film 10 can be peeled off from the substrate 21 in a state where the electronic component 31 is held at the time of energy ray irradiation.

The adhesive force of the adhesive that forms the joint layer 13 is not particularly limited. When the adhesive is bonded to stainless steel, left for 60 minutes, and then peeled off from the surface of the stainless steel, the 180° peeling adhesive force measured in accordance with JIS Z0237 can be set to 0.1 N/25 mm or more and 50 N/25 mm or less, can be further set to 0.2 N/25 mm or more and 25 N/25 mm or less, and can be further set to 0.3 N/25 mm or more and 8 N/15 mm or less. The above measurement value is a value obtained by separately providing the joint layer 13 on a 38 μm-thick biaxially stretched PET film.

(4) Another Layer

The film 10 of the present invention may include only the base layer 11, the holding layer 12, and the joint layer 13, but may include another layer.

Examples of the other layer include an interfacial strength improvement layer that improves interfacial strength with an adhesive, and an anti-migration layer that suppresses migration of low molecular weight components from the base layer 11 to the holding layer 12.

These tests may be used singly or in combination of two or more kinds thereof.

[3] Component Manufacturing Tool

The component manufacturing tool 20 (see FIGS. 3(*a*) and 3(*b*)) of the present invention is used to simultaneously evaluate electric characteristics of the electronic components 31 in a heated state. The component manufacturing tool 20 includes the substrate 21 and the holding layer 12 (see FIGS. 3(*a*) and 3(*b*)).

The holding layer 12 is a layer provided on one surface side of the substrate 21 to hold a plurality of the electronic components 31 side by side.

Specifically, the component manufacturing tool 20 can be configured by bonding the above-described film 10 to one surface side of the substrate 21 with the above-described joint layer 13 interposed therebetween.

(1) Substrate

The substrate 21 is provided for the purpose of arranging the electronic components 31 at an appropriate measurement position in the evaluation step to be described later.

The material of the substrate 21 is not particularly limited, but is preferably a hard material that does not bend at the time of the evaluation step. Thus, as the material of the substrate 21, a metallic material such as stainless steel, aluminum, iron, or copper; a non-metallic inorganic material such as glass, fine ceramics, or silicon wafer; or a resin material can be used. These tests may be used singly or in combination of two or more kinds thereof. Note that examples of the resin material among the materials described above include various resins mentioned as materials constituting the resin base layer 11 (base layer 11) constituting the component manufacturing film 10.

For example, the Young's modulus of the substrate 21 can be set to 10 GPa or more.

Furthermore, the thickness of the substrate 21 is not limited, but can be set to, for example, 1 mm or more and 500 mm or less, 2 mm or more and 250 mm or less, or 3 mm or more and 150 mm or less.

As described above, as shown in FIG. 3(*b*), the component manufacturing tool 20 is not limited to the configuration in which the film 10 is bonded, and can be configured by providing only the holding layer 12 on one surface side of the substrate 21.

In this case, as the holding layer 12, the same adhesive as that used in the holding layer 12 of the film 10 described above can be used.

INDUSTRIAL APPLICABILITY

The electronic component manufacturing method, electronic component manufacturing film, and electronic component manufacturing tool of the present invention are widely used in applications of manufacturing an electronic component. In particular, the method is suitably used for manufacturing a component having characteristics capable of simultaneously measuring a plurality of electronic components and having excellent productivity.

REFERENCE SIGNS LIST

10; component manufacturing film,
11; base layer,
12; holding layer,
13; joint layer,
20; component manufacturing tool,
21; substrate,
30; precursor component,
31; electronic component,
315; electrode,
40; support (segmenting support),
41; frame,
45; support (evaluating support),
50; probe card;
51; probe.

The invention claimed is:

1. An electronic component manufacturing method comprising:

a segmentation step of segmenting a precursor electronic component on a support different from the support used in the arrangement step to obtain electronic components;

an arrangement step of arranging, on a support having a substrate and a holding layer that has a characteristic in which its holding force decreases upon heat application or energy-ray irradiation, 300 or more of the electronic components, each having exposed electrodes, via the holding layer; and an evaluation step of evaluating electric characteristics of 300 or more of the electronic components arranged on the support by simultaneously connecting the exposed electrodes and probes and performing conduction evaluation while the electronic components are heated to 150° C. or higher;

wherein the substrate is formed using a heat-resistant resin, has a melt peak temperature of 200° C. or higher as measured in accordance with JIS K7121 Industrial Standard, and has a tensile elastic modulus E' (160) of 100 MPa or more at a temperature of 160° C., and wherein the holding layer is formed of an adhesive, and the adhesive has a 180° peeling adhesive force of 0.3 N/25 mm or more and 8 N/25 mm or less, measured in accordance with JISZ0237 except that the adherend used in the measurement is a silicon wafer.

2. The electronic component manufacturing method according to claim 1, wherein the holding layer includes thermally expandable particles and has a characteristic that a holding force is reduced by heating.

3. The electronic component manufacturing method according to claim 1, wherein the support includes a component manufacturing film adhered to one surface side of the substrate, and the component manufacturing film includes a resin base layer, the holding layer provided on one surface side of the resin base layer, and a joint layer that is provided on an opposite side of the resin base layer and bonds the component manufacturing film to the substrate.

4. The electronic component manufacturing method according to claim 1, wherein the resin base layer has a linear thermal expansion coefficient of 100 ppm/K or less.

* * * * *